United States Patent
Wang et al.

(10) Patent No.: US 11,526,395 B2
(45) Date of Patent: *Dec. 13, 2022

(54) WRITE BUFFER MANAGEMENT

(71) Applicant: Micron Technology, Inc., Boise, ID (US)

(72) Inventors: Wei Wang, Dublin, CA (US); Jiangli Zhu, San Jose, CA (US); Ying Yu Tai, Mountain View, CA (US); Ning Chen, San Jose, CA (US); Zhengang Chen, San Jose, CA (US); Cheng Yuan Wu, Fremont, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/100,571

(22) Filed: Nov. 20, 2020

(65) Prior Publication Data

US 2021/0073068 A1  Mar. 11, 2021

Related U.S. Application Data

(63) Continuation of application No. 16/039,683, filed on Jul. 19, 2018, now Pat. No. 10,877,835.

(51) Int. Cl.
*G06F 11/07* (2006.01)
*G11C 29/52* (2006.01)
*G06F 11/10* (2006.01)

(52) U.S. Cl.
CPC ...... *G06F 11/0793* (2013.01); *G06F 11/0727* (2013.01); *G06F 11/0751* (2013.01); *G06F 11/1068* (2013.01); *G11C 29/52* (2013.01)

(58) Field of Classification Search
CPC ............ G06F 11/1048; G06F 11/0787; G06F 11/1068; G11C 29/42; G11C 29/44; G11C 7/1045
See application file for complete search history.

(56) References Cited

U.S. PATENT DOCUMENTS

| | | | |
|---|---|---|---|
| 4,887,235 A | 12/1989 | Holloway et al. | |
| 5,313,473 A | 5/1994 | Darmon et al. | |
| 10,877,835 B2 * | 12/2020 | Wang | G06F 11/0793 |
| 2002/0073376 A1 | 6/2002 | Otake et al. | |
| 2009/0245083 A1 * | 10/2009 | Hamzeh | H04L 1/0017 370/204 |

(Continued)

FOREIGN PATENT DOCUMENTS

JP     2015-215774 A     12/2015

OTHER PUBLICATIONS

International Search Report and Written Opinion dated Jan. 23, 2020, on application No. PCT/US19/42461.

(Continued)

*Primary Examiner* — Guy J Lamarre
(74) *Attorney, Agent, or Firm* — Lowenstein Sandler LLP

(57) ABSTRACT

A read operation to retrieve data stored at a memory device is performed. Whether the data retrieved from the memory device includes an error that is not correctable is determined. Responsive to determining that the data retrieved from the memory device comprises the error that is not correctable, a buffer in a data path along which a write operation was performed to write the data at the memory device is searched for the data.

20 Claims, 5 Drawing Sheets

(56) References Cited

U.S. PATENT DOCUMENTS

| | | |
|---|---|---|
| 2010/0313096 A1 | 12/2010 | Lee |
| 2011/0035634 A1 | 2/2011 | Blaum et al. |
| 2011/0161666 A1 | 6/2011 | Gladwin et al. |
| 2012/0284587 A1 | 11/2012 | Yu et al. |
| 2013/0019076 A1 | 1/2013 | Amidi et al. |
| 2013/0300591 A1* | 11/2013 | Marpe .................... H03M 7/46 341/67 |
| 2014/0053016 A1 | 2/2014 | Dusanapudi et al. |
| 2014/0237319 A1 | 8/2014 | Seo et al. |
| 2015/0161004 A1 | 6/2015 | Camp et al. |
| 2015/0286527 A1 | 10/2015 | Wu et al. |
| 2016/0132259 A1 | 5/2016 | Dell |
| 2018/0018590 A1* | 1/2018 | Szeto .................... G06N 20/10 |
| 2018/0039541 A1 | 2/2018 | Hahn et al. |

OTHER PUBLICATIONS

Supplemental European Search Report on application No. EP 19837962, dated Mar. 17, 2022.

* cited by examiner

WRITE BUFFER MANAGEMENT

RELATED APPLICATIONS

This application is a continuation application of co-pending U.S. patent application Ser. No. 16/039,683, filed Jul. 19, 2018, which is hereby incorporated by reference herein.

TECHNICAL FIELD

Implementations of the disclosure relate generally to memory sub-systems, and more specifically, relate to write buffer management in memory sub-systems.

BACKGROUND

A memory sub-system can be a storage system, such as a solid-state drive (SSD), and can include one or more memory components that store data. A memory sub-system can include memory components such as non-volatile memory components and volatile memory components. In general, a host system can utilize a memory sub-system to store data at the memory components of the memory sub-system and to retrieve data from the memory components of the memory sub-system.

BRIEF DESCRIPTION OF THE DRAWINGS

The disclosure will be understood more fully from the detailed description given below and from the accompanying drawings of various implementations of the disclosure.

DETAILED DESCRIPTION

Figure 1:
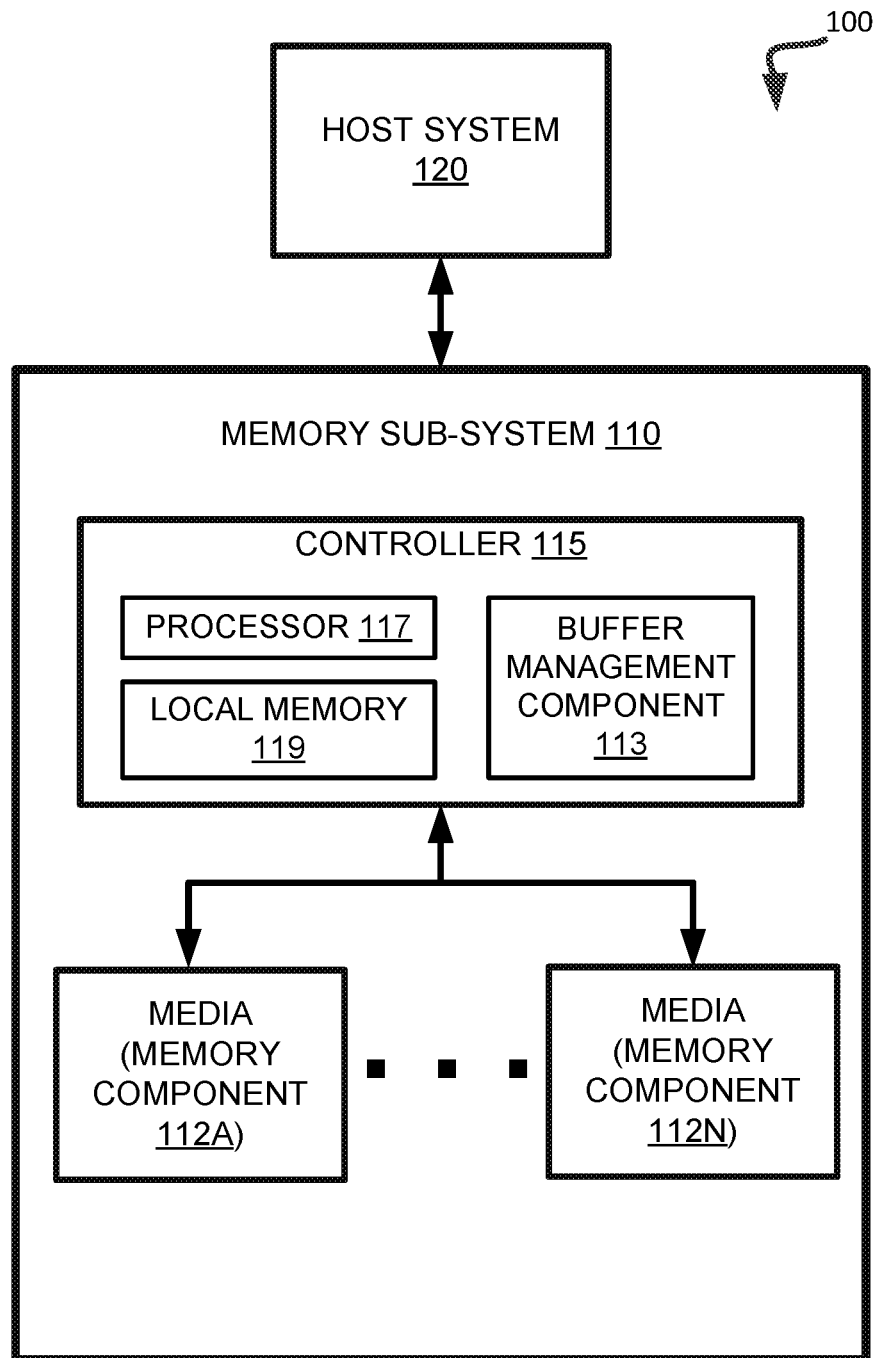
FIG. 1 illustrates an example computing environment that includes a memory sub-system, in accordance with some implementations of the disclosure.

Aspects of the present disclosure are directed to buffer management in memory sub-systems. A memory sub-system is also hereinafter referred to as a "memory device". An example of a memory sub-system is a storage system, such as a solid-state drive (SSD). In some implementations, the memory sub-system is a hybrid memory/storage sub-system. In general, a host system can utilize a memory sub-system that includes one or more memory components. The host system can provide data to be stored at the memory sub-system and can request data to be retrieved from the memory sub-system.

The memory components used by the memory sub-system can have particular characteristics that provide challenges in the operation of the memory sub-system. For example, memory components can have a characteristic where reading data from a location at the memory components within a window of time (e.g., within 1 millisecond (ms)) after the data has been written to the location at the memory component can cause a large number of errors in the data. The number of errors can be beyond the error correction capability of the error correcting code (ECC) used by the memory sub-system and can cause a read failure. Some conventional systems perform read operations on memory components after a delay period (e.g., over 1 ms) to ensure that the data written to a location on the memory components is correctly programmed and to avoid data corruption. The delay period can reduce the quality of service of the memory sub-system by causing a lengthy latency in retrieving the data from the memory components and returning the data to the host system.

In the performance of write operations, a memory sub-system can load and store the data to be written at a buffer (e.g., recent write buffer). The data stored at the buffer can be used to write the data to the memory components. Data from the buffer can be read without a delay (e.g., delayed read) and the data can be retrieved from the buffer with a relatively small number of errors. The buffer can store the data for a certain amount of time until, for example, the data is overwritten by new data associated with a new write operation. The new data is stored on the buffer and is used to write to the memory components. Some conventional systems, in the performance of a read operation, inspect the buffer in search for the data to be read for every read operation before reading the data from the memory components. Initially searching for the data at the buffer for every read operation can reduce the data corruption caused by the characteristics of the memory components, but can also contribute to reduced quality of service by increasing the latency in retrieving the data and returning the data to the host system. For instance, initially searching for the data at the buffer for every read operation takes time, which contributes to increased latency. As buffers get larger, the latency caused by initially searching for the data at the buffer for every read operation increases. The number of read operations that are performed at locations of memory components that have been recently written to can be a proportionally small amount of the total number of read operations of a memory sub-system, which makes the latency caused by initially searching for the data at the buffer for every read operation even more undesirable.

Aspects of the disclosure address the above and other deficiencies by performing a read operation that bypasses an initial search for the data at a buffer and that directly reads data from the memory components. In some implementations, initial error correcting code operations are performed on the data retrieved from the memory components. Responsive to determining that the data is not corrupt or is corrected by the error correcting code operations, the data is returned to the host system. Responsive to determining that the data cannot be corrected by the initial error correcting code operations, the controller searches the buffer for the data. In some implementations, responsive to finding the data at the buffer the data from the buffer is returned to the host system and is used to re-program (e.g., re-write) the memory components.

Aspects of the disclosure, such as performing a read operation that bypasses an initial search for the data at a buffer and that directly reads data from the memory components, improves the operation of memory sub-systems by improving the quality of service of memory sub-systems by reducing latency in the return of data (e.g., to a host system) and improving the speed of memory sub-systems in the performance of memory operations, such as a read operation. Additionally, the operation of memory sub-system is further improved by increasing the reliability of data stored at the memory sub-system by, for example, reprogramming memory components using data from a buffer of a controller.

FIG. 1 illustrates an example computing environment 100 that includes a memory sub-system 110 in accordance with some implementations of the present disclosure. The memory sub-system 110 can include media, such as memory components 112A to 112N. The memory components 112A to 112N can be volatile memory components, non-volatile memory components, or a combination of such. In some implementations, the memory sub-system is a storage system. An example of a storage system is a SSD. In some implementations, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some implementations, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some implementations, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some implementations, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another implementation of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

In some implementations, controller 115 can include host memory translation circuitry (not shown) that includes hardware (e.g., circuitry), software (e.g., firmware), or a combination thereof that is used for translating host instructions received from host interface circuitry. The host memory translation circuitry can be configured to translate host addresses (e.g., logical addresses) to memory addresses (e.g., physical addresses) of memory components 112A-112N. For example, the host system 120 can send one or more requests (e.g., read request, write request, etc.) to controller 115. The requests can include a host command and host addresses of data on which the host command is to be performed. For instance, a read request can include a host read command and the host addresses of the data that is requested to be read. A write request can include a host write command and the host addresses of the data that is requested to be written. The host addresses can be converted by host memory translation circuitry into memory addresses, such as the physical memory addresses that identifying specific data units of the memory components 112A-112N.

The memory sub-system 110 can also include additional circuitry or components that are not illustrated. In some implementations, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a buffer management component 113 (e.g., circuitry, dedicated logic, programmable logic, firmware, etc.) to perform the operations described herein. In some implementations, the controller 115 includes at least a portion of the buffer management component 113. For example, the controller 115 can include a processor 117 (processing device) configured to execute instructions stored in local memory 119 for performing the operations described herein. In some implementations, the buffer management component 113 is part of the host system 110, an application, or an operating system.

In some implementations, the buffer management component 113 can receive a request from a host system 120 to read data stored at memory components 112. Responsive to the request to read the data, buffer management component 113 performs a read operation that reads the data from the memory components 112, which bypasses an initial search for the data at a buffer in a read data path associated with the read operation. Responsive to performing the read operation that bypasses the initial search for the data at the buffer, buffer management component 113 returns the data to the host system 120. Further details with regards to the operations of the buffer management component 113 are described below.

Figure 2:
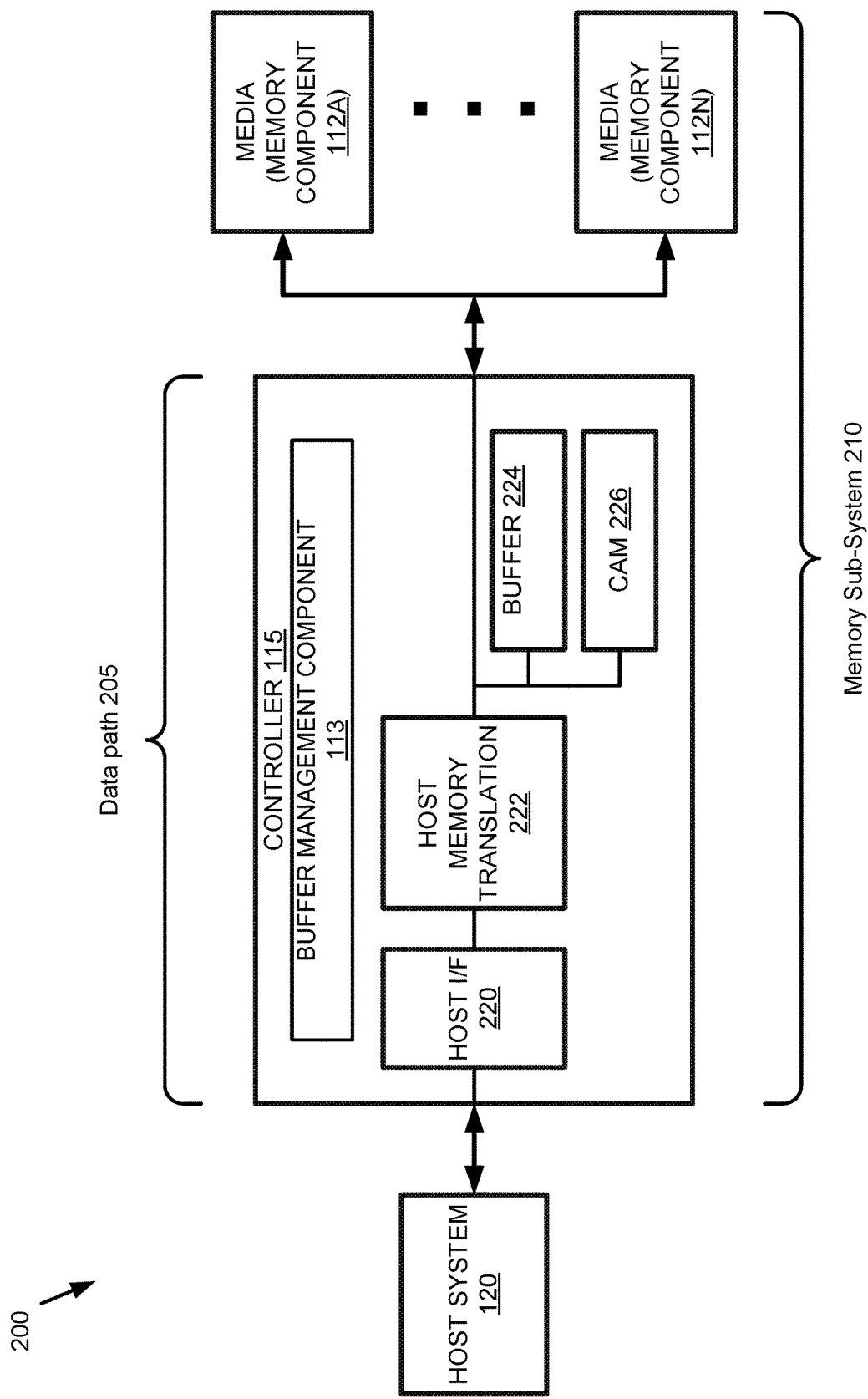
FIG. 2 illustrates another example computing environment that includes a memory sub-system, in accordance with some implementations of the disclosure.

FIG. 2 illustrates another example computing environment 200 that includes a memory sub-system, in accordance with some implementations of the disclosure. Elements of computing environment 100 of FIG. 1 can be used to help illustrate FIG. 2. For example, computing environment 200 includes host system 120, controller 115, and memory components 112A-112N of FIG. 1. It can be noted that computing environment 200 is provided for purposes of illustration, rather than limitation. In implementations, computing environment 200 can include some, all, none, more or different elements of computing environment 100 of FIG. 1. It can also be noted that memory sub-system 210 of computing environment 200 can include some, all, none, more or different elements of memory sub-system 110 of FIG. 1. Buffer management component 113 can perform one or more of the operations described with respect to controller 115 of FIG. 2.

In some implementations, controller 115 can include host interface (I/F) 220, host memory translation 222, buffer 224, content-addressable memory (CAM) 226, and buffer management component 113.

In some implementations, memory components 112A-112N can include non-volatile memory components, such a non-volatile memory components that include a cross-point array of non-volatile memory cells. As noted above, a cross-point array of non-volatile memory can perform bit storage based on a change of bulk resistance, in conjunction with a stackable cross-gridded data access array. Additionally, in contrast to many flash-based memories that perform write out-of-place operations (e.g., data at location that is to be written is erased before other data can be programmed to the location), cross point non-volatile memory can perform a write in-place operation, where a non-volatile memory cell can be programmed without the non-volatile memory cell being previously erased. Aspects of the disclosure can be applied to other types of non-volatile memory components or other types of memory components generally.

In some implementations, controller 115 can include a host interface (I/F) 220 that includes hardware (e.g., circuitry), software (e.g., firmware), or a combination thereof that is used for interfacing with the host system 120. The host interface 220 can convert command packets received from the host system (e.g., using peripheral component interconnect express (PCIe) bus) into command instructions for the host memory translation 222. The host interface 220 can also convert responses from the host memory translation 222 into host commands for transmission to host system 120. For example, host system 120 can send to host interface 220 of controller 115 a read request to read data stored at memory components 112, a write request to store data at memory components 112, or an erase request to erase data stored at memory components 112. Host interface 220 can convert the read request to a read operation that is performed by the controller 115 to read data stored at memory components 112 and return the data to host system 120. Host interface 220 can convert the write request to a write operation that is performed by the controller 115 to write data received from host system 120 to memory components 112. Host interface can convert the erase request to an erase operation that is performed by the controller 115 to erase data at memory components 112. Read operations, write operations, erase operations are examples of some memory operations.

In some implementations, controller 115 can include host memory translation 222 that includes hardware (e.g., circuitry), software (e.g., firmware), or a combination thereof that is used for translating host instructions received from host interface 220. The host memory translation 222 can be configured to translate host addresses (e.g., logical addresses) to memory addresses (e.g., physical addresses) of memory components 112. For example, the host system 120 can send one or more requests (e.g., read request, write request, etc.) to controller 115. The requests can include a host command and host addresses of data on which the host command is to be performed. For instance, a read request can include a host read command and the host addresses of the data that is requested to be read. A write request can include a host write command and the host addresses of the data that is requested to be written. The host addresses can be converted by host memory translation 222 into memory addresses, such as the physical memory addresses identifying specific logical unit numbers (LUN) of the memory components 112. A logical unit number can refer to a unit of memory. For example, a unit of memory can be a die of memory component 112. In other implementations, the unit of memory can be a different amount of memory.

In some implementations, controller 115 can include buffer 224 that can include hardware (e.g., circuitry), software (e.g., firmware), or a combination thereof to store data (e.g., also referred to as "host data" herein) that is to be written or that has been recently written (e.g., within 1 ms) at memory components 112. In some implementations, buffer 224 (also referred to as a "recent write buffer" or "write buffer" herein) can include volatile memory such as static random access memory (SRAM). For example, in the performance of a write operation (e.g., responsive to a write request from host system 120) controller 115 can temporarily store the data to be written on buffer 224, and retrieve the data from buffer 224 to write the data to memory components 112. As new data is received by buffer 224 (e.g., responsive to new write requests), older data at the buffer 224 is overwritten (e.g., using first-in first-out (FIFO) scheme).

In some implementations, controller 115 can include content-addressable memory (CAM) 226 that can include hardware (e.g., circuitry), software (e.g., firmware), or a combination thereof to store information indicative of the data stored at buffer 224. In some implementations, in the performance of a write operation, data is stored on buffer 224 and the memory addresses (e.g., of memory components 112) associated with the data can be stored at content-addressable memory 226. In implementations, content-addressable memory 226 can implement a lookup-table function where the content-addressable memory 226 receives a data word (e.g., memory address) and searches its memory to determine whether the data is stored at the content-addressable memory 226. In some implementations, responsive to finding the data word, content-addressable memory 226 can return the data at the buffer that is associated with the data word or the location of the data at the buffer. In some implementations, content-addressable memory 226 can perform the lookup-table function in a single clock cycle using dedicated comparison circuitry.

In implementations, to perform a read operation, controller 115 can perform a search for the data at buffer 224. Controller 115 can search content-addressable memory 226 for the associated memory address of the data. Responsive to finding the memory address of the data to be read at content-addressable memory 226, controller 115 can determine that the data is stored at buffer 224 and retrieve the data from buffer 224 (e.g., rather than memory components 112). Responsive to not finding the memory address of the data to be read at content-addressable memory 226, controller 115 can determine that the data is not stored at content-addressable memory 226.

In implementations, elements of controller 115 illustrate a simplified data path 205 (e.g., read data path or write data path) used in the performance of a read operation or write operation. The data path 205 can include one or more functional units that perform data processing operations. The data path 205 includes host interface 220, host memory translation 222, buffer 224, and content-addressable memory 226. The data path of the computing environment 200 can more generally referred to host system 120, data path 205 of controller 115, and memory components 112.

Figure 3:
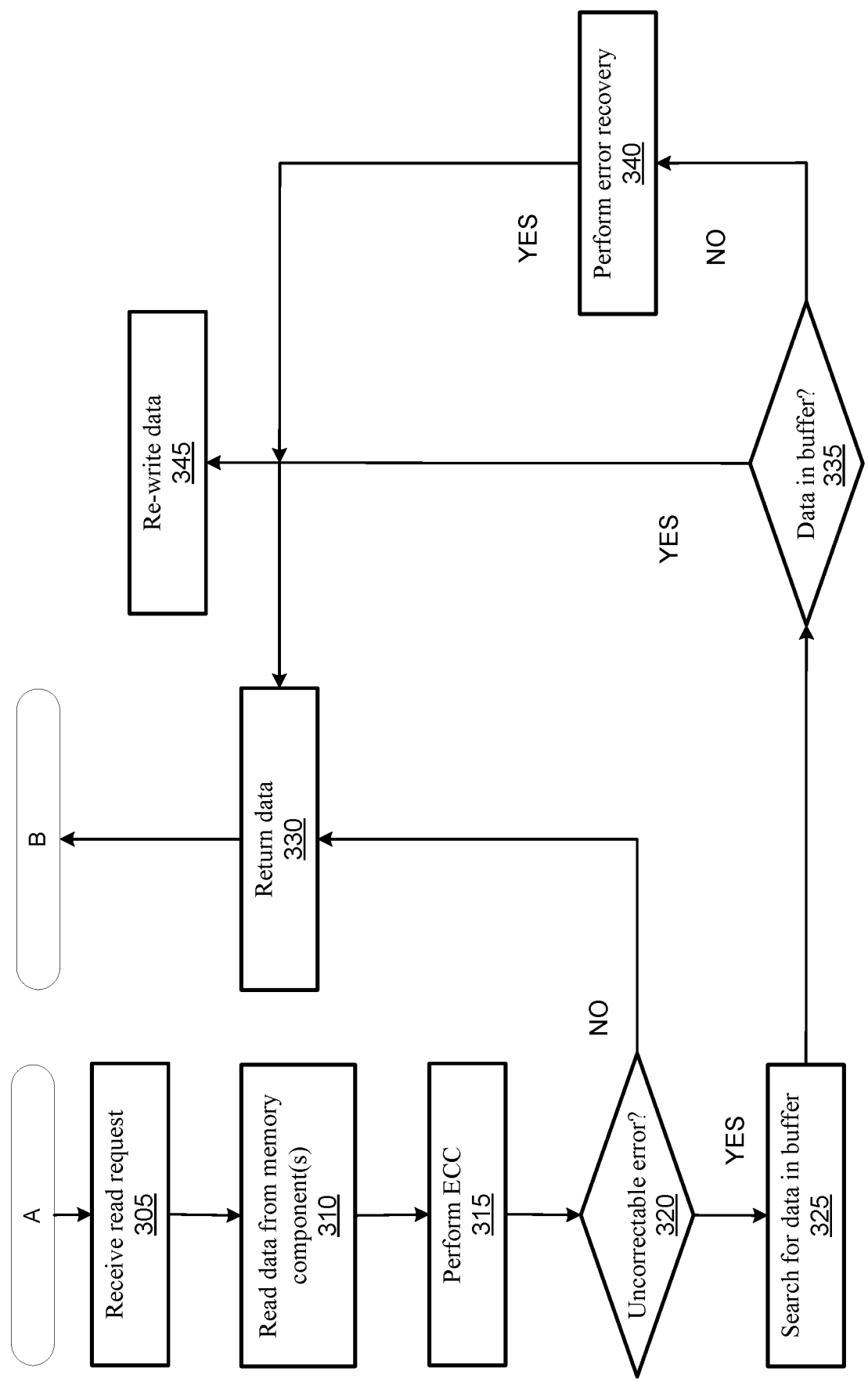
FIG. 3 is a flow diagram of an example method of performing a read operation, in accordance with some implementations.

FIG. 3 is a flow diagram of an example method of performing a read operation, in accordance with some implementations. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some implementations, method 300 can be performed by the buffer management component 113 of the controller 115 of FIG. 1 or FIG. 2. It can be noted that in other implementations, method 300 can include the same, different, additional, or fewer operations performed in the same or different order. Although shown in a particular sequence or order, unless otherwise specified, the order of the processes can be modified. Thus, the illustrated implementations should be understood only as examples, and the illustrated operations can be performed in a different order, and some operations can be performed in parallel. Additionally, one or more operations can be omitted in various implementations. Thus, not all operations are required in every implementation. Other process flows are possible. Elements of the preceding Figures can be used to help illustrated FIG. 3.

At block 305, processing logic receives a read request from host system 120 to read data stored at memory components 112. A read request is further described with respect to FIG. 2.

At block 310, processing logic, responsive to the read request, performs a read operation and reads the data from memory components 112. Processing logic can read the data from memory components 112 using one or more memory addresses associated with the data. In implementations, to perform the read operation processing logic bypasses an initial search (also referred to as "prior search" herein) for the data at buffer 224 in the data path 205 associated with the read operation. For example, rather than performing an initial search for the data at buffer prior to searching for the data at memory components 112, controller 115 can bypass the initial search of the data at buffer 224 and read the data directly from memory components 112 (e.g., without previously searching for the data at buffer 224).

At block 315, processing logic performs one or more error correcting code (ECC) operations on the data read from memory components 112. In some implementations, controller 115 can perform one or more error correcting code operations to attempt to detect or correct errors in the data. For example, the one or more error correcting code operations can detect one or more errors of the data. Responsive to detecting an error, controller 115 can perform one or more additional error correcting code operations to correct a number of errors of the data. The one or more error correcting code operations can correct a number of errors that is less than or equal to the error correcting code's correction capability (also referred to as "t" herein). If the number of errors in the data is greater than the error correcting code's correction capability, then the error correcting code is not able to correct all the errors in the data (e.g., uncorrectable error). In implementations, the error correcting code operations can be associated with one or more classes of error correcting codes, such as parity check, product code, Bose-Chaudhuri-Hocquenghem (BCH) code, Low Density Parity Code (LDPC), among others.

At block 320, processing logic determines whether or not the data read from memory components 112 is absent an error in view of the one or more error correcting code operations. In one implementation, processing logic does not detect any errors in the data read from memory components 112. Responsive to determining that the data does not contain any errors, processing logic can proceed to block 330 and return the data read from the memory components 112 to host system 120.

In another implementation, processing logic can determine the one or more error correcting code operations performed on the data corrects one or more errors (e.g., correctable error) of the data read from the memory components 112 (e.g., the number of errors of the data is less than or equal to the error correction capability of the error correcting code). Responsive to determining that the errors in the data have been corrected (and no errors remain in the data), processing logic can proceed to block 330 and return the corrected data to host system 120.

In some implementation, the one or more error correcting code operations cannot correct the one or more errors (e.g., uncorrectable errors) detected in the data (e.g., the number of errors of the data is greater than or equal to the error correction capability of the error correcting code). Processing logic can determine that the one or more error correcting code operations does not correct the error(s) (e.g., uncorrectable error) of the data read from the memory components 112. Responsive to determining that the one or more error correcting code operations does not correct the error of the data read from the memory components 112 (e.g., the error(s) are uncorrectable), processing logic can proceed to block 325 to perform a subsequent search for the data at buffer 224.

At block 325, processing logic performs a subsequent search (e.g., subsequent to reading the data from memory components 112) for the data at buffer 224. A search for data at buffer 224 is further described with respect to FIG. 2.

At block 335, responsive to performing the subsequent search for the data at buffer 224, processing logic determines whether or not the data is stored at buffer 224. In implementations, responsive to determining that the data is stored at buffer 224, processing logic reads the data from buffer 224 and proceeds to block 330 to return the data read from buffer 224 to host system 120. In implementations, responsive to determining that the data is stored at buffer 224, processing logic reads the data from buffer 224 and proceeds to block 345 to re-write data at memory components 112. It can be noted that in instances where the data read from memory components 112 has been corrupted by reading the data immediately after the data was written to the memory components 112 (as described above), re-writing the data can correct the corrupted data. In some implementations, responsive to determining that the data is not stored at buffer 224, processing logic proceeds to block 340 to perform error recovery.

At block 340, responsive to determining that the data is not stored at buffer 224, processing logic performs one or more error recovery operations to correct the errors (e.g., the uncorrectable errors via ECC of block 320) in the data read from memory components 112. The error recovery operations can be similar to error correcting code operations, such that the error recovery operations can correct a number of errors that is less than or equal to the error recovery's correction capability (or can include similar classes of ECC). In some implementations, the error recovery operations are more complex than error correcting code operations of block 315 (e.g., change device read parameters, ECC parameters, etc.). In implementations, the error correction ability of the error recovery operations can be greater than the error correction ability of the error correcting code operations of block 315 (e.g., can correct a greater number of errors). In some implementations, the latency caused by the performance of the error recovery operations can be greater than the latency caused by the performance of error correcting code operations of block 315. For example, the performance of the error recovery operations takes longer than the error correcting code operations of block 310, which can cause a greater delay in returning the data to host system 120.

In some implementations, responsive to determining the error recovery operation are unsuccessful in correcting the errors in the data read from memory components 112, processing logic generates a report (e.g., identifying the data with the uncorrectable error) and submits the report to host system 120 (not shown).

In some implementations, responsive to correcting the errors in the data read from the memory components 112 using the error recovery operations, processing logic can proceed to block 330 and return the corrected data to host system 120. In some implementations, responsive to correcting the errors in the data read from the memory components 112 using the error recovery operations, processing logic proceeds to block 345 to re-write data to memory components 112.

At block 330 (as noted above), processing logic returns the data to host system 120 responsive to the read request (e.g., block 305).

At block 345, processing logic performs a write operation (e.g., re-write operation) to write the data stored at the buffer to the memory components 112. In some implementations, the write operation is an in-place write operation. In some implementations, the performance of the write operation writes the data of the buffer 224 to the same location (e.g., same memory address) of the memory components 112 from which the read operation read the data (e.g. at block 310). It can be noted that the data can be corrupted by the read operation (e.g., block 310), and processing logic re-writes the data to the same location of the memory components 112 to correct the corrupted data. In some implementations, processing logic can perform operations of block 330 and block 345 concurrently, serially, or otherwise.

Figure 4:
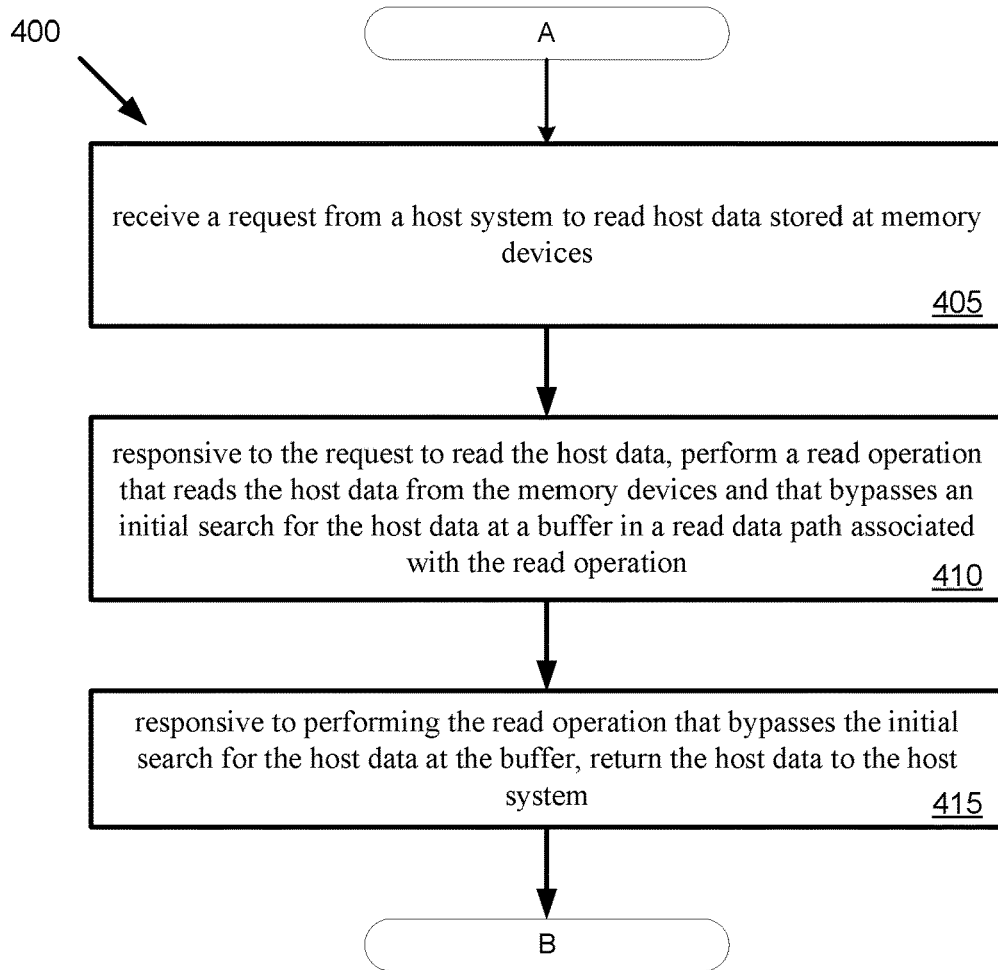
FIG. 4 is a flow diagram of an example method of performing a read operation, in accordance with some implementations.

FIG. 4 is a flow diagram of an example method of performing a read operation, in accordance with some implementations. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some implementations, method 400 can be performed by the buffer management component 113 of the controller 115 of FIG. 1 or FIG. 2. It can be noted that in other implementations, method 400 can include the same, different, additional, or fewer operations performed in the same or different order. Although shown in a particular sequence or order, unless otherwise specified, the order of the processes can be modified. Thus, the illustrated implementations should be understood only as examples, and the illustrated operations can be performed in a different order, and some operations can be performed in parallel. Additionally, one or more operations can be omitted in various implementations. Thus, not all operations are required in every implementation. Other process flows are possible. Elements of the preceding Figures can be used to help illustrated FIG. 4.

At block 405, processing logic receives a request from a host system 120 to read host data stored at memory components 112. At block 410, responsive to the request to read the host data, processing logic performs a read operation that reads the host data from the memory components 112 and that bypasses an initial search for the host data at a buffer 224 in a read data path 205 associated with the read operation. At block 415, responsive to performing the read operation that bypasses the initial search for the host data at the buffer 224, processing logic returns the host data to the host system 120.

Figure 5:
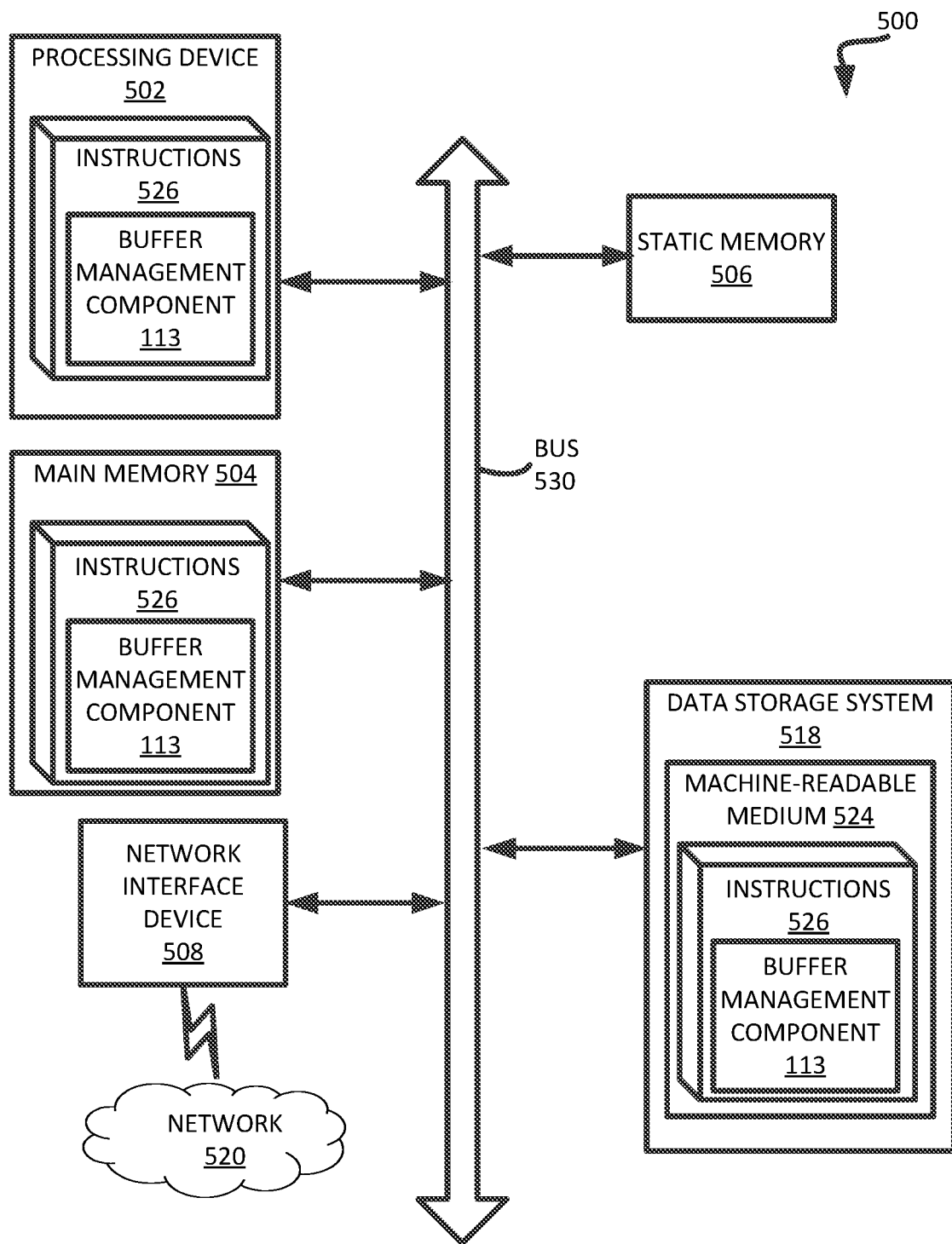
FIG. 5 is a block diagram of an example machine of a computer system in which implementations of the disclosure can operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1 or memory sub-system 210 of FIG. 2) or can be used to perform the operations of a controller (e.g., to execute an operating system to perform operations corresponding to the buffer management component 113 of FIG. 1 or FIG. 2). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1 or memory sub-system 210 of FIG. 2.

In one embodiment, the instructions 526 include instructions to implement functionality corresponding to a buffer management component (e.g., the buffer management component 113 of FIG. 1 or FIG. 2). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims can generally be construed to mean "one or more" unless specified otherwise or clear from context to be directed to a singular form. Moreover, use of the term "an implementation" or "one implementation" or "an embodiment" or "one embodiment" throughout is not intended to mean the same implementation or embodiment unless described as such. The terms "first," "second," "third," "fourth," etc. as used herein are meant as labels to distinguish among different elements and may not necessarily have an ordinal meaning according to their numerical designation.

What is claimed is:

1. A system comprising:
   a memory device; and
   a processing device, coupled to the memory device, the processing device to perform operations comprising:
      performing a read operation to retrieve data stored at the memory device;
      determining whether the data retrieved from the memory device comprises an error that is not correctable; and
      responsive to determining that the data retrieved from the memory device comprises the error that is not correctable, searching for the data at a buffer in a data path along which a write operation was performed to write the data at the memory device.

2. The system of claim 1, wherein performing the read operation to retrieve the data stored at the memory device comprises:
   reading the data directly from the memory device without a prior performance of an initial search of the buffer to determine whether the data is stored at the buffer.

3. The system of claim 1, wherein the processing device to perform the operations further comprising:
   performing one or more error correcting code operations on the data retrieved from the memory device.

4. The system of claim 3, wherein the processing device to perform the operations further comprising:
   determining that the one or more error correcting code operations performed on the data corrects the error of the data retrieved from the memory device; and
   responsive to determining that the one or more error correcting code operations corrects the error, return the corrected data to a host system.

5. The system of claim 3, wherein the processing device to perform the operations further comprising:
   determining that the data retrieved from the memory device comprises the error that is not correctable error in view of the performance of the one or more error correcting code operations.

6. The system of claim 5, wherein the processing device to perform the operations further comprising:
   determining that the data is stored at the buffer; and
   responsive to determining that the data is stored at the buffer, retrieving the data from the buffer, wherein the data retrieved from the buffer is returned to a host system.

7. The system of claim 6, wherein the processing device to perform the operations further comprising:
   responsive to determining that the data is stored at the buffer, performing an in-place write operation to write the data from the buffer to the memory device.

8. The system of claim 7, wherein the in-place write operation writes the data to a same location of the memory device from which the read operation retrieved the data.

9. The system of claim 6, wherein the processing device to perform the operations further comprising:
   responsive to determining that the data is not stored at the buffer, performing error recovery operations on the data.

10. The system of claim 1, wherein the memory device comprises a non-volatile memory device at which in-place write operations are performed.

11. The system of claim 1, wherein the buffer comprise a volatile memory device to store data most recently written at the memory device.

12. A method comprising:
    performing a read operation to retrieve data stored at a memory device;
    determining, by a processing device, whether the data retrieved from the memory device comprises an error that is not correctable; and
    responsive to determining that the data retrieved from the memory device comprises the error that is not correctable, searching for the data at a buffer in a data path along which a write operation was performed to write the data at the memory device.

13. The method of claim 12, wherein performing the read operation to retrieve the data stored at the memory device, comprises:
    reading the data directly from the memory device without a prior performance of an initial search of the buffer to determine whether the data is stored at the buffer.

14. The method of claim 12, further comprising:
performing one or more error correcting code operations on the data retrieved from the memory device.

15. The method of claim 14, further comprising:
determining that the data retrieved from the memory device comprises the error that is not correctable error in view of the performance of the one or more error correcting code operations;
determining that the data is stored at the buffer; and
responsive to determining that the data is stored at the buffer, retrieving the data from the buffer, wherein the data retrieved from the buffer is returned to a host system.

16. A non-transitory computer-readable medium comprising instructions that, responsive to execution by a processing device, cause the processing device to perform operations comprising:
performing a read operation to retrieve data stored at a memory device;
determining, by a processing device, whether the data retrieved from the memory device comprises an error that is not correctable; and
responsive to determining that the data retrieved from the memory device comprises the error that is not correctable, searching for the data at a buffer in a data path along which a write operation was performed to write the data at the memory device.

17. The non-transitory computer-readable medium of claim 16, wherein performing the read operation to retrieve the data stored at the memory device, comprises:
reading the data directly from the memory device without a prior performance of an initial search of the buffer to determine whether the data is stored at the buffer.

18. The non-transitory computer-readable medium of claim 16, wherein the instructions to cause the processing device to perform the operations further comprising:
performing one or more error correcting code operations on the data retrieved from the memory device.

19. The non-transitory computer-readable medium of claim 18, wherein the instructions to cause the processing device to perform the operations further comprising:
determining that the data retrieved from the memory device comprises the error that is not correctable error in view of the performance of the one or more error correcting code operations;
determining that the data is stored at the buffer; and
responsive to determining that the data is stored at the buffer, retrieving the data from the buffer, wherein the data retrieved from the buffer is returned to a host system.

20. The non-transitory computer-readable medium of claim 19, wherein the instructions to cause the processing device to perform the operations further comprising:
responsive to determining that the data is stored at the buffer, performing an in-place write operation to write the data from the buffer to the memory device.

* * * * *